(12) United States Patent
Yamaguchi et al.

(10) Patent No.: US 9,013,170 B2
(45) Date of Patent: Apr. 21, 2015

(54) LIGHTNING CURRENT DETECTION SENSOR

(75) Inventors: Kengou Yamaguchi, Tokyo (JP); Tatsufumi Aoi, Tokyo (JP); Takashi Okai, Tokyo (JP)

(73) Assignee: Mitsubishi Aircraft Corporation, Aichi (JP)

( * ) Notice: Subject to any disclaimer, the term of this patent is extended or adjusted under 35 U.S.C. 154(b) by 252 days.

(21) Appl. No.: 13/358,209

(22) Filed: Jan. 25, 2012

(65) Prior Publication Data

US 2012/0194168 A1 Aug. 2, 2012

(30) Foreign Application Priority Data

Jan. 28, 2011 (JP) .................................. 2011-16183

(51) Int. Cl.
*G01R 31/02* (2006.01)
*G01R 29/08* (2006.01)
*B64D 45/02* (2006.01)

(52) U.S. Cl.
CPC ............ *G01R 29/0842* (2013.01); *B64D 45/02* (2013.01)

(58) Field of Classification Search
CPC .......... G01R 29/0842; G01R 29/0814; G01R 19/0092; G01R 19/04; G01R 19/12; G01R 19/15; G01R 19/165; B64D 45/02
USPC ........ 324/72, 72.5, 207.13–207.15, 173, 179, 324/234; 336/174, 175, 84 R, 211
See application file for complete search history.

(56) References Cited

U.S. PATENT DOCUMENTS

| | | | | |
|---|---|---|---|---|
| 3,503,126 A | * | 3/1970 | Faller | ............................ 29/602.1 |
| 4,295,112 A | * | 10/1981 | Yamada et al. | ............ 336/84 M |
| 4,468,089 A | * | 8/1984 | Brorein | .......................... 385/114 |
| 4,611,191 A | | 9/1986 | Souchere | |
| 5,206,596 A | * | 4/1993 | Beihoff et al. | ................ 324/536 |

(Continued)

FOREIGN PATENT DOCUMENTS

| | | |
|---|---|---|
| JP | 60-108769 A | 6/1985 |
| JP | S60-256067 A | 12/1985 |

(Continued)

OTHER PUBLICATIONS

European Search Report for application 12151550.6-1524 dated May 24, 2012.

(Continued)

*Primary Examiner* — Huy Q Phan
*Assistant Examiner* — Thang Le
(74) *Attorney, Agent, or Firm* — Pearne & Gordon LLP (57) ABSTRACT

The present invention has an object to provide a lightning current detection sensor that has a configuration resistant to high voltage and high current in a lightning strike and has high sensitivity and high resolution. In a lightning current detection sensor 10, an insulation-coated wire 22 wound in multiple turns is collectively covered with a base tape 21 and a cover tape 23. Thus, even when the insulation-coated wire 22 is wound in multiple turns to increase sensitivity, a minute area can be detected to increase resolution. Also, with the base tape 21 and the cover tape 23 covering the insulation-coated wire 22 and also a shield portion 12 made of an insulating material and a gap 40 formed between the shield portion 12 and the coil portion 20, a sufficient shielding property is ensured and detection with high accuracy can be performed against high current and high voltage without capacitative coupling.

7 Claims, 10 Drawing Sheets

(56) References Cited

U.S. PATENT DOCUMENTS

| | | | |
|---|---|---|---|
| 5,446,239 A | 8/1995 | Mizutani et al. | |
| 5,770,992 A * | 6/1998 | Waters | 336/84 R |
| 6,265,871 B1 * | 7/2001 | Logue et al. | 324/240 |
| 6,437,555 B1 * | 8/2002 | Pioch et al. | 324/127 |
| 6,963,195 B1 * | 11/2005 | Berkcan | 324/117 R |
| 2006/0232902 A1 * | 10/2006 | Woolsey et al. | 361/93.1 |
| 2008/0007249 A1 * | 1/2008 | Wilkerson et al. | 324/127 |
| 2008/0054881 A1 * | 3/2008 | Kim | 324/117 R |
| 2011/0043190 A1 * | 2/2011 | Farr | 324/126 |
| 2011/0163741 A1 * | 7/2011 | Suzuma et al. | 324/240 |
| 2012/0007595 A1 * | 1/2012 | Lepage | 324/239 |

FOREIGN PATENT DOCUMENTS

| | | |
|---|---|---|
| JP | H02-56884 A | 2/1990 |
| JP | H06-36141 A | 5/1994 |
| JP | 7-38324 A | 2/1995 |
| JP | 10-332754 A | 12/1998 |
| JP | 2005-043318 A | 2/2005 |
| JP | 2006-343196 A | 12/2006 |
| JP | 2009-535616 A | 10/2009 |

OTHER PUBLICATIONS

Van Deursen A.P.J. et al "Design of sensors for in-flight lightning detection on aircrafts" Electromagnetics in advanced applications, 2009. ICEAA '09. International Conference on, IEEE, Piscataway, NJ, USA, Sep. 14, 2009, pp. 825-828, XP031559802, ISBN: 978-1-4244-3385-8.

Ildas Consortium "Final Publishable Information—Adapted from Final Report" 2009, pp. 1-24, XP002675846, Online Retrieved from the Internet: URL: http://cordis.europa.eu/documents/documentlibrary/123652701EN19.doc, retrieved on May 10, 2012.

Anonymous "Turck: Universal Magnetic Field Sensors" Nov. 2007, pp. 1-6, XP002675847, Online Retrieved from the Internet: URL: http://www.turck-usa.com/illustrations/B1111_Universal%20Magnetic%20Field%20Sensors.pdf, retrieved on May 11, 2012.

Japanese Office Action issued in corresponding Application No. 2011-016183 dated Apr. 9, 2014.

* cited by examiner

LIGHTNING CURRENT DETECTION SENSOR

BACKGROUND OF THE INVENTION

1. Field of the Invention

The present invention relates to a lightning current detection sensor for detecting a current flowing in a lightning strike and a simulation current of the current flowing in the lightning strike.

2. Description of the Related Art

Aircraft are required to take all possible measures to ensure safety in a lightning strike. When a main wing of an aircraft is struck by lightning and a large current flows, the current partially or, in some cases, entirely flows through connecting portions between wing surface panels on a surface of the wing. If a value of the current exceeds a limit value of a passage allowable current at each connecting portion, electric discharge referred to as an electric arc (or thermal spark) occurs. This is considered to be a phenomenon in which an instantaneous large current flows through the connecting portions between wing surface panels mainly made of a conductive material to cause a sudden increase in temperature, and as a result, melting and vaporization of a member causes electric discharge in surrounding atmosphere. When this phenomenon occurs, melts referred to as hot particles are scattered from a melting portion in many cases.

Generally, an inner space of a wing also functions as a fuel tank, and in the lighting strike, it is necessary to prevent occurrence of the electric arc or seal the arc to prevent electric discharge of the arc that has occurred and hot particles scattered thereby from contacting flammable fuel vapor.

Thus, the applicant has made various studies and proposals to prevent an electric arc. In the process of the studies, the need has arisen to evaluate how a current flows in a lightning strike to check effectiveness of measures against a lightning strike.

Figure 7:
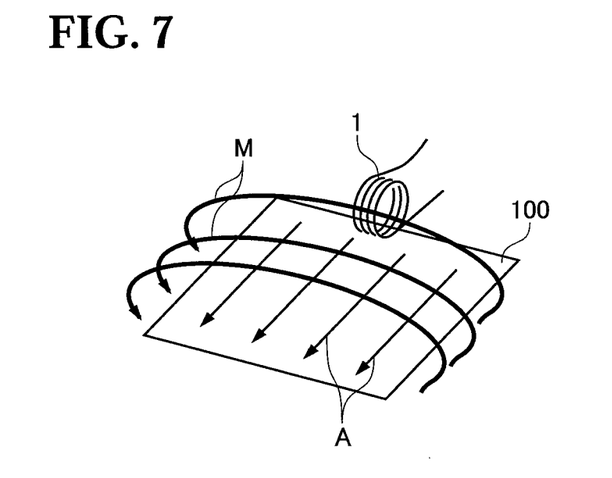
FIG. 7 shows a principle for detecting a lightning current by a magnetic sensor.

To evaluate how a current flows in a lightning strike, as shown in FIG. 7, a magnetic field M that is produced in an object 100 through which a current A flows by a lightning strike is detected by a magnetic detection sensor 1.

A general magnetic detection sensor includes, for example, a sensor using a magnetic detection coil with an annular band-like conductor (for example, see Japanese Patent Laid-Open No. 2006-343196), or a sensor using a thin film flux gate (for example, see National Publication of International Patent Application No. 2009-535616), but these sensors are not suitable for evaluating how a current flows in a lightning strike.

Figure 8:
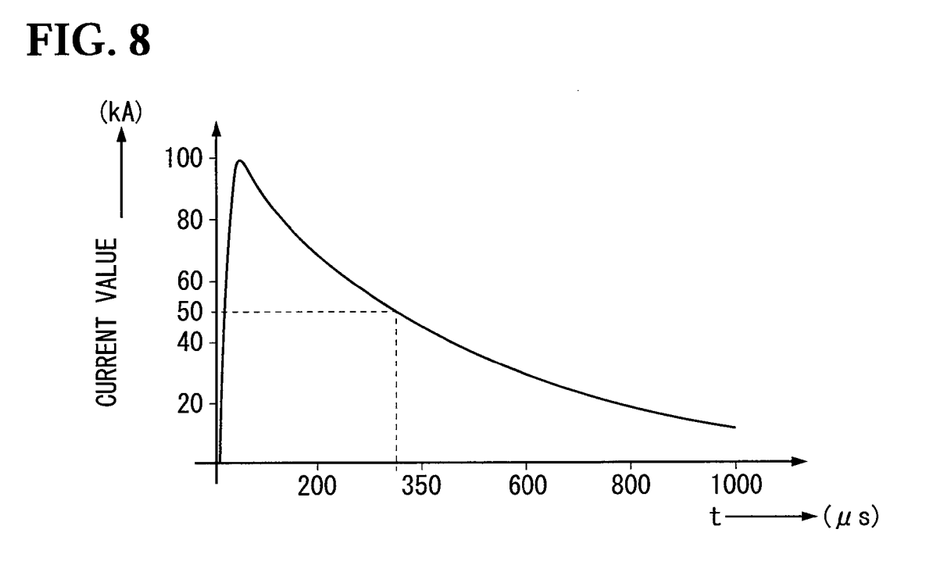
FIG. 8 shows an example of changes in current with time in a lightning strike.

Specifically, in a lightning strike, as shown in FIG. 8, a high current of several tens to 200 kA and a high voltage of 40 to 50 kV flow in a short time, and noise contamination cannot be avoided. As a magnetic detection sensor for detecting a lightning current, a sensor resistant to high current and high voltage needs to be used, but the techniques described in Japanese Patent Laid-Open No. 2006-343196 and National Publication of International Patent Application No. 2009-535616 are intended for detecting a minute magnetic field and does not assume use for detecting a lightning current.

Figure 9:
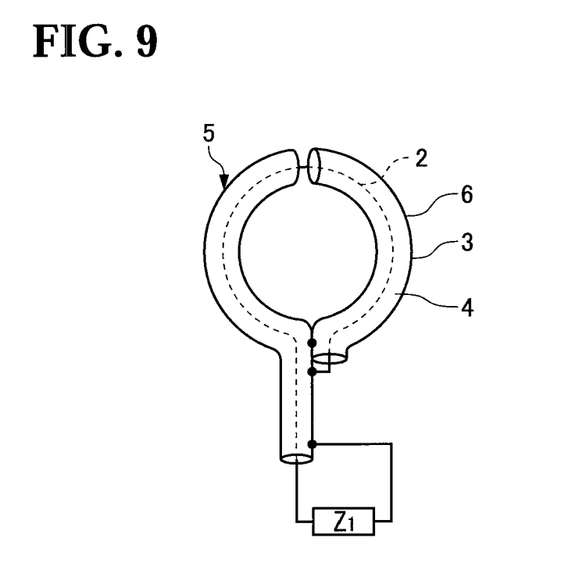
FIG. 9 shows a configuration of a shield loop antenna.

When a high current and a high voltage flow, noise contamination occurs due to capacitive coupling with a surrounding electric field, and this makes it difficult to detect only a magnetic field produced by a current change. Thus, as a magnetic detection sensor 1 resistant to high current and high voltage, for example, as shown in FIG. 9, a shield loop antenna 5 in which a looped core wire 2 is passed through a copper pipe 3 and an insulating material 4 is filled between the copper pipe 3 and the core wire 2 is conventionally generally used. Such a shield loop antenna 5 can avoid influence by an electric field because the copper pipe 3 and the insulating material 4 form a shield against an electric field.

SUMMARY OF THE INVENTION

However, the shield loop antenna 5 has a configuration constituted by a so-called coaxial pipe (semi-rigid cable) 6 in which the core wire 2 is passed through the copper pipe 3 via the insulating material 4. In this case, a copper pipe 3 having an outer diameter of 2 to 3 mm is generally used except in a particular case.

Figure 10:
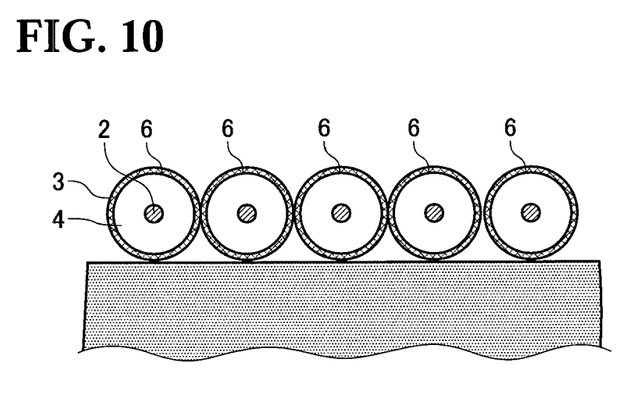
FIG. 10 is a sectional view showing an example when a shield loop antenna is provided in multiple turns.

To increase detection sensitivity, the coaxial pipe 6 is generally wound in multiple turns, for example, as shown in FIG. 10, but a size reduction is difficult because of limitation of an outer shape and curvature of a cable. Thus, a magnetic field detection area requires a certain volume, and detection limited to a minute area is difficult, and limitation of installation site or density reduces detection resolution.

The present invention is achieved based on such technical problems, and has an object to provide a lightning current detection sensor that has a configuration resistant to high voltage and high current in a lightning strike and has high sensitivity and high resolution.

To achieve the object, the present invention provides a lightning current detection sensor for detecting a lightning current flowing through an object to be detected in a lightning strike, including: a core made of an insulating material; and a coil portion wound around an outer peripheral surface of the core, wherein the coil portion includes an insulation-coated wire circumferentially wound around the core in multiple turns, and a shield cover that collectively covers the insulation-coated wire wound in multiple turns.

Such a lightning current detection sensor detects a magnetic field produced by a lightning current flowing through the object to be detected in a lightning strike, as a voltage generated at a wire end that constitutes the insulation-coated wire of the coil portion. The wire is covered with an insulating coating that constitutes the insulation-coated wire, and also shielded by the shield cover. This can reduce noise contamination due to capacitive coupling with an outside, and allows only a magnetic field to be detected.

At this time, since the insulation-coated wire is wound in multiple turns, detection with high sensitivity can be performed. Also, the insulation-coated wire wound in multiple turns is collectively covered with the shield cover. This prevents an increase in a magnetic detection area as in a coaxial pipe, and allows magnetic detection of a minute area. For such use, the insulation-coated wire preferably has a diameter of 1 mm or less. For the above, a normal shield loop antenna is intended to detect a magnetic field band ranging up to a several GHz, but a frequency component contained in a lightning current is about 100 kHz maximum, and the shield loop antenna has an excessive characteristic. In measurement with application of the present invention, a supposed distance between a sensor and a measuring instrument is several meters maximum. The entire measurement system has a size sufficiently within a range of practical use because the system has a wavelength sufficiently shorter than a wavelength of a standing wave in the same band and an influence of misalignment of a cable impedance is small.

The lightning current detection sensor further includes: a base made of an insulating material; and a spacer that is interposed between the base and the core and forms a gap between the base and the coil portion.

The base and the gap formed by the spacer can reliably ensure an electrical gap between the wire of the insulation-coated wire and an object struck by lightning. This increases a shielding property and ensures detection of only a magnetic field.

Further, a side plate standing upward from the base, and a top portion provided to cover an upper end of the side plate and above the core may be provided integrally with the base, and the top portion may hold a signal wire connected to the insulation-coated wire. This allows the signal wire to be reliably held in a position remote from the object struck by lightning, and this also prevents noise contamination.

The shield cover may include a band-like base tape that is circumferentially provided along an outer peripheral surface of the core, made of a conductive material and grounded, and a band-like cover tape provided to cover the insulation-coated wire on the base tape, made of a conductive material and grounded. The base tape and the cover tape are preferably made of a copper tape material.

The lightning current detection sensor described above can be used for detecting a current in a lightning strike of various objects, not limited to aircraft.

Further, the "lightning strike" in the present invention is not limited to an actual lightning strike, but includes a simulation lightning strike in an examination performed by applying a high current and a high voltage.

According to the present invention, the wire is covered with the insulating coating that constitutes the insulation-coated wire, and also shielded by the shield cover. This can prevent capacitive coupling and noise contamination to allow detection of only a magnetic field, and increase detection sensitivity.

Further, the base and the gap formed by the spacer reliably ensure an electrical gap between the wire of the insulation-coated wire and the object struck by lightning. This can further increase a shielding property and more reliably increase detection sensitivity.

The insulation-coated wire wound in multiple turns is collectively covered with the shield cover, thereby allowing magnetic detection in a minute area, and increasing resolution.

DETAILED DESCRIPTION OF THE PREFERRED EMBODIMENTS

Now, the present invention will be described in detail based on an embodiment shown in the accompanying drawings.

Figure 1:
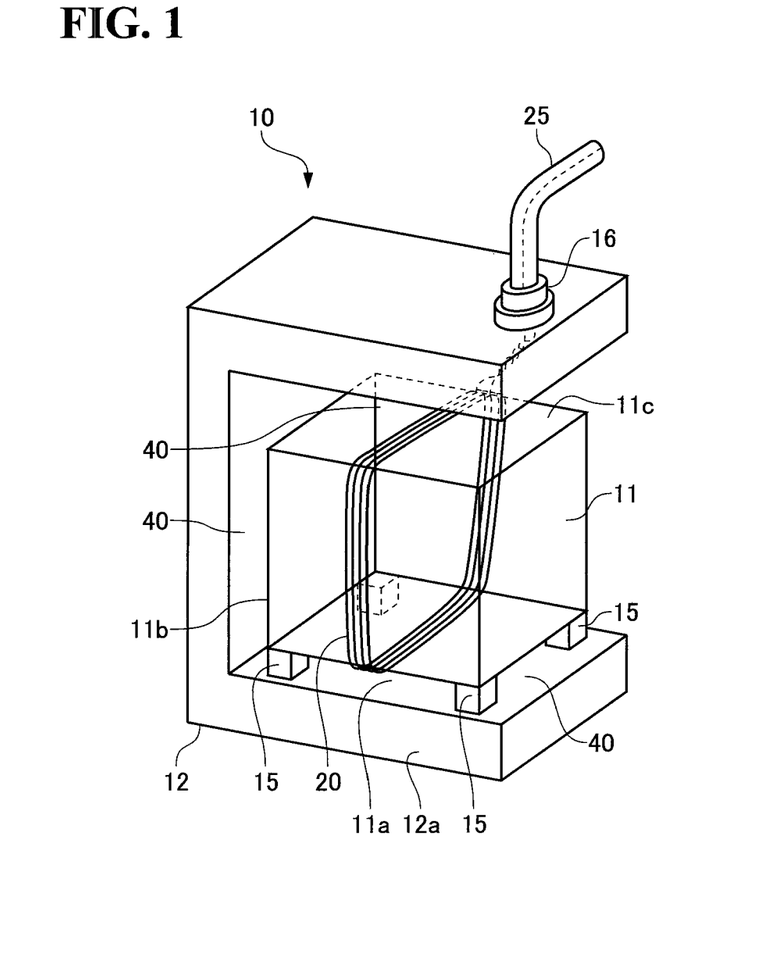
FIG. 1 is a perspective view showing a schematic configuration of a lightning current detection sensor according to an embodiment.

FIG. 1 illustrates a configuration of a lightning current detection sensor 10 according to this embodiment.

As shown in FIG. 1, the lightning current detection sensor 10 includes a cubic core 11, a coil portion 20 circumferentially wound around the core 11, and a shield portion 12 surrounding the core 11.

The core 11 may be formed of an insulating material such as acrylic or styrofoam, and may be, for example, 24 to 40 mm on a side.

Figure 2:
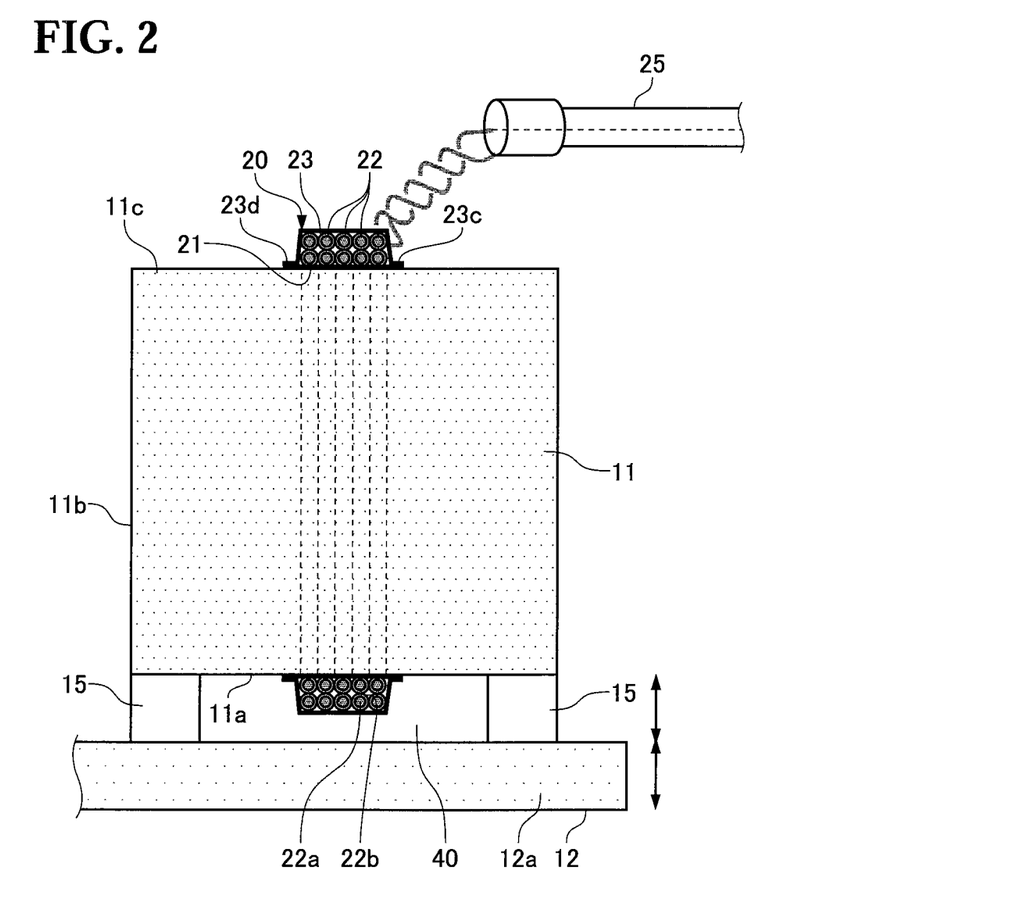
FIG. 2 is a vertical sectional view of the lightning current detection sensor taken along a section perpendicular to a continuing direction of a coil portion.
Figure 3:
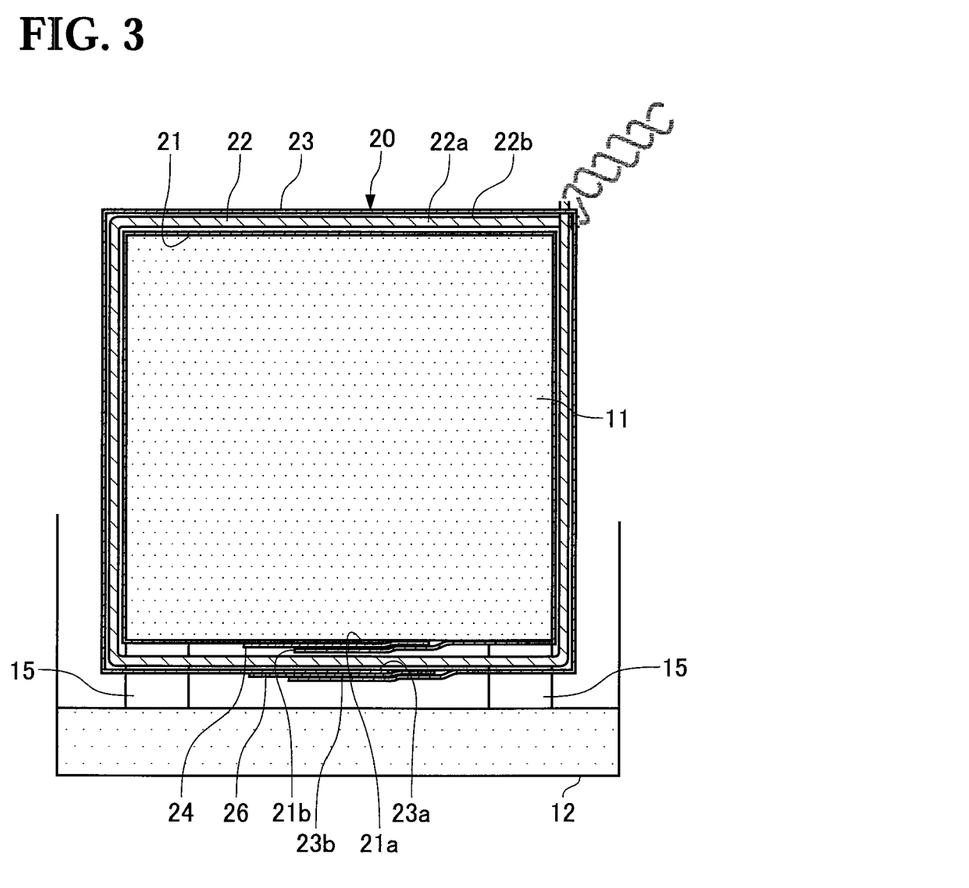
FIG. 3 is a vertical sectional view taken in a direction perpendicular to the direction in FIG. 2.

As shown in FIGS. 2 and 3, the coil portion 20 includes a band-like base tape 21 wound along an outer surface of the core 11, an insulation-coated wire 22 wound around an outer periphery of the base tape 21, and a band-like cover tape 23 wound to cover the insulation-coated wire 22.

The base tape 21 may be, for example, a band-like copper tape. Ends 21a and 21b of the base tape 21 overlap via an insulation tape 24 on a lower surface of the core 11. The base tape 21 is grounded by an unshown ground line.

The insulation-coated wire 22 includes a copper wire 22a with an insulating coating 22b of polyurethane or enamel, and is wound around the outer periphery of the base tape 21. The insulation-coated wire 22 having a diameter of, for example, 0.2 to 0.3 mm is preferably used.

Figure 4A:
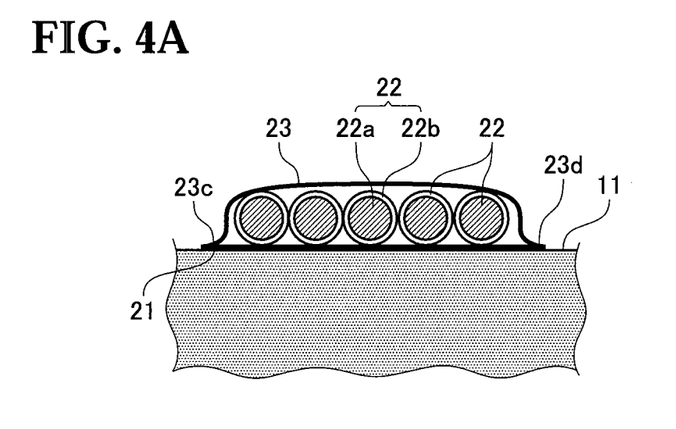
FIG. 4A is a sectional view showing an example of an insulation-coated wire of a coil portion wound in a single layer.
Figure 4B:
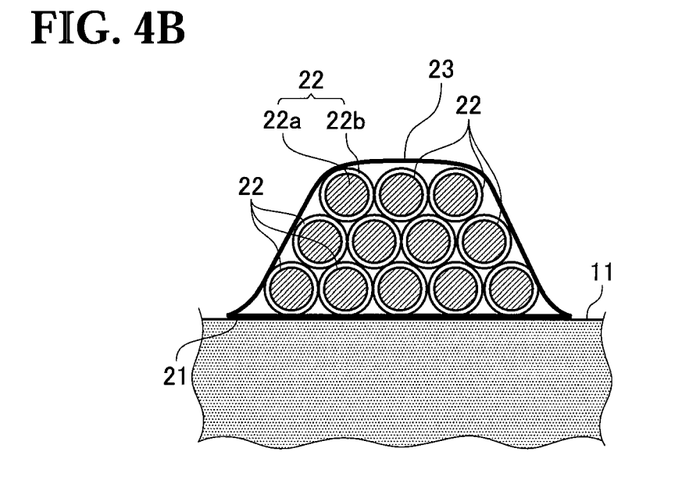
FIG. 4B is a sectional view showing an example of the insulation-coated wire wound in multiple layers.

The insulation-coated wire 22 may be wound around the core 11 in multiple turns, and as required, may be wound in a single layer or multiple layers as shown in FIGS. 4A and 4B. The insulation-coated wire 22 is led out in a direction away from the core 11, and connected to an unshown measurement device via a signal wire 25 constituted by a coaxial cable.

The cover tape 23 may be, for example, a band-like copper tape. The cover tape 23 that covers the insulation-coated wire 22 on the base tape 21 has opposite ends 23c and 23d in a width direction joined to the base tape 21 by an adhesive or the like on opposite sides of the insulation-coated wire 22. Ends 23a and 23b of the cover tape 23 overlap via an insulation tape 26 on the lower surface of the core 11. The cover tape 23 is grounded by an unshown ground line.

Thus, the insulation-coated wire 22 wound in multiple turns is covered with a shield cover constituted by the base tape 21 and the cover tape 23.

As shown in FIG. 1, the shield portion 12 has, for example, a squared U-shaped, and surrounds a bottom surface 11a, a side surface 11b, and an upper surface 11c of the core 11 around which the coil portion 20 is wound. The shield portion 12 may be made of an insulating material such as acrylic or styrofoam.

The core 11 is supported by a bottom plate (base) 12a of the shield portion 12 via a spacer 15 having a predetermined height (thickness) of, for example, 10 mm, and thus a gap 40 is formed between the coil portion 20 and the shield portion 12. The spacer 15 can be made of an insulating material such as acrylic.

The gap 40 of a predetermined size is also formed between a side plate 12b and a top plate 12c of the shield portion 12 and the coil portion 20.

A holding portion 16 that holds a signal wire 25 is formed on the top plate 12c of the shield portion 12.

The lightning current detection sensor 10 having the configuration described above is used, for example, with the bottom plate 12a of the shield portion 12 being placed on a surface of a main wing of an aircraft.

Such a lightning current detection sensor 10 detects a magnetic field passing inside the coil portion 20 using the copper wire 22a of the insulation-coated wire 22, and thus detects a lightning current flowing along the surface of the main wing in a lightning strike. The measurement device connected to the insulation-coated wire 22 of the coil portion 20 detects changes with time in the magnetic field detected by the insulation-coated wire 22 as an induced voltage, and thus measures a lightning current flowing along the surface of the main wing in a lightning strike.

In the lightning current detection sensor 10 described above, the insulation-coated wire 22 wound in multiple turns is covered with the base tape 21 and the cover tape 23. Thus, even when the insulation-coated wire 22 is wound in multiple turns to increase sensitivity, a minute area can be detected to increase resolution.

Furthermore, on account of the insulating coating 22b, the base tape 21, and the cover tape 23, and also the shield portion 12 made of an insulating material and the gap 40 formed between the shield portion 12 and the coil portion 20, the copper wire 22a that detects a magnetic field has a sufficient shielding property and can perform detection with high accuracy against high current and high voltage without capacitive coupling.

Figure 5:
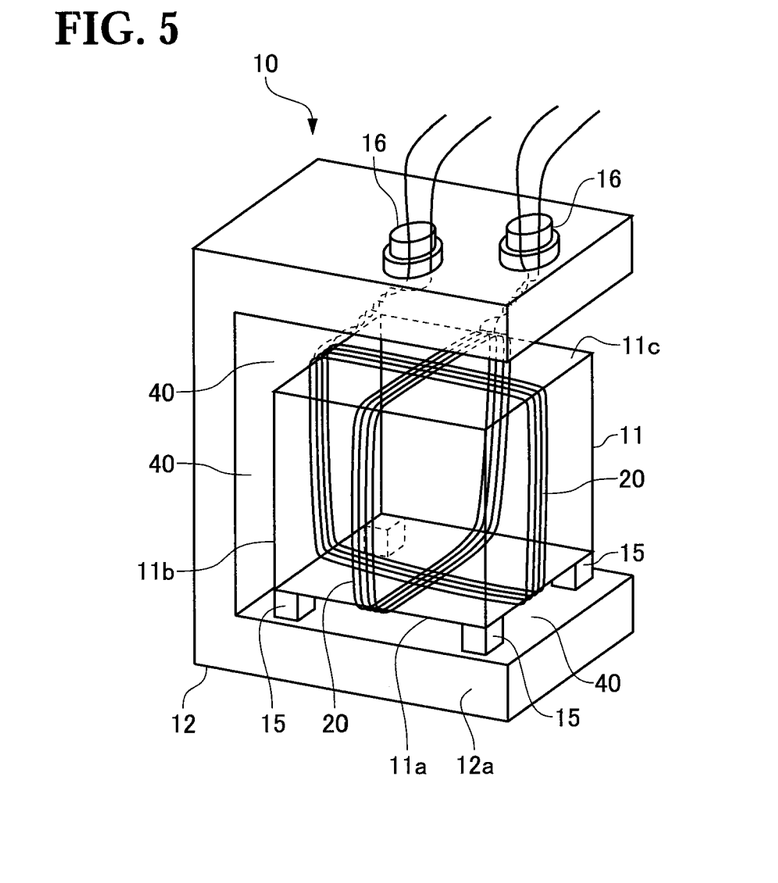
FIG. 5 is a perspective view showing a schematic configuration of a lightning current detection sensor for two-dimensional detection.

Coil portions 20 may be two-dimensionally or three-dimensionally provided. FIG. 5 shows an example of the coil portions 20 two-dimensionally provided. As shown in FIG. 5, the coil portions 20 are wound around the core 11 in two directions perpendicular to each other. Each coil portion 20 has the same configuration as described above.

When the coil portions 20 are three-dimensionally provided, the coil portions 20 may be wound around the core 11 in three directions perpendicular to each other.

The lightning current detection sensor 10 including such multidimensional coil portions 20 can simultaneously detect lightning currents in different directions and has a high detection capability.

In the above embodiment, the insulation-coated wire 22 of the coil portion 20 is wound in multiple turns, but the number of turns is not limited.

Further, the configurations described in the embodiment may be chosen or changed to other configurations without departing from the gist of the present invention.

Example 1

A demonstration experiment for the above configuration was performed, and a result thereof will be described.

As the lightning current detection sensors 10 having the above configuration, a lightning current detection sensor including the insulation-coated wire 22 wound only in one turn around the core 11 of 4 cm on a side (Example 1), and a lightning current detection sensor including the insulation-coated wire 22 wound in 10 turns (Example 2) were prepared.

For comparison, a lightning current detection sensor that does not include the shield structure such as the base tape 21, the cover tape 23, the shield portion 12 made of a shielding material, and the gap 40 formed between the shield portion 12 and the coil portion 20. Specifically, only a copper wire was wound in 10 turns around the surface of the core 11 of 4 cm on a side without using the base tape 21 and the cover tape 23 (comparative example).

Figure 6A:
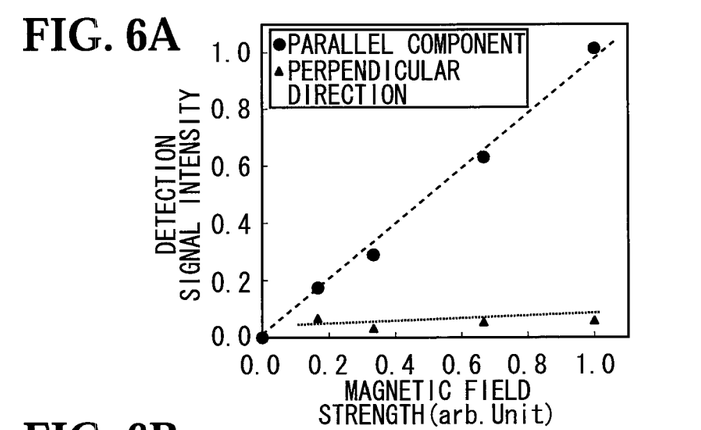
FIGS. 6A, 6B and 6C show detection results in Examples.
Figure 6B:
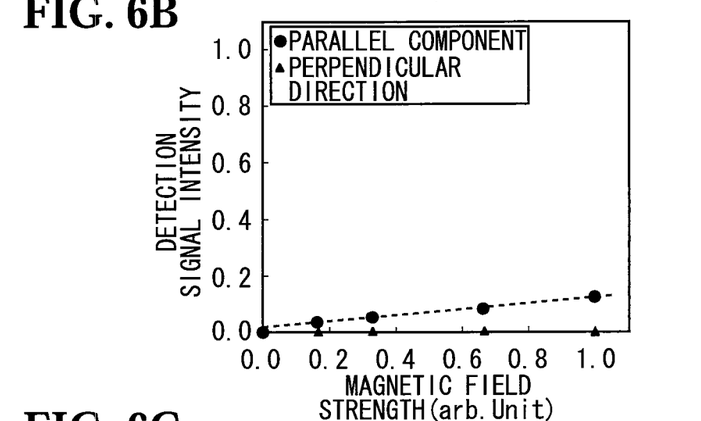
Figure 6C:
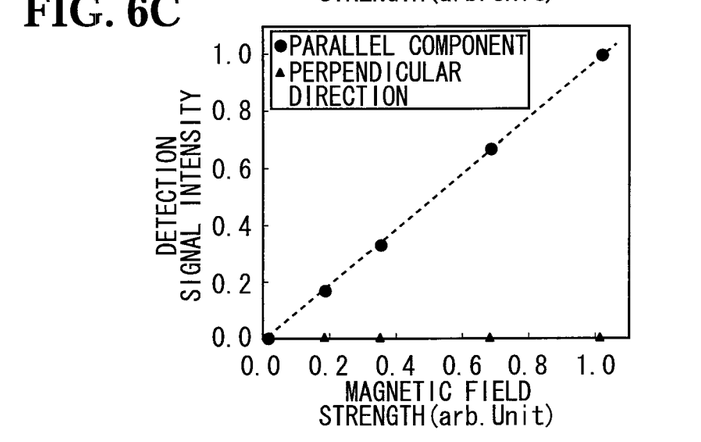

FIGS. 6A, 6B and 6C show a relationship between magnetic field strength and detection signals when a simulation lightning current of 3 kA is passed through the lightning current detection sensors described above in Examples 1 and 2 and the comparative example.

As shown in FIG. 6A, in the comparative example, a detection signal (magnetic flux density) parallel to a flowing direction of the lightning current is detected, and a detection signal perpendicular to the flowing direction of the lightning current is also detected, which is not normally detected, and this signal forms a noise component. This reduces a signal-to-noise ratio.

In contrast to this, as shown in FIG. 6B, for the configuration with the insulation-coated wire 22 wound only in one turn, the detection signal parallel to the flowing direction of the lightning current is low. A detection signal perpendicular to the flowing direction of the lightning current is not detected.

Further, as shown in FIG. 6C, for the configuration with the insulation-coated wire 22 wound in multiple turns, the detection signal parallel to the flowing direction of the lightning current is high. A detection signal perpendicular to the flowing direction of the lightning current is not detected. This reveals that detection can be performed with a high signal-to-noise ratio and high sensitivity.

What is claimed is:

1. A lightning current detection sensor for detecting a lightning current flowing through an object to be detected in a lightning strike, comprising:
    a core made of an insulating material; and
    a coil portion wound around an outer peripheral surface of the core,
    wherein the coil portion includes an insulation coated wire circumferentially wound around the core in multiple turns, and a shield cover that collectively covers the insulation-coated wire wound in multiple turns, wherein the shield cover includes:
        a band-like base tape that is circumferentially provided along an outer peripheral surface of the core and is overlapped at ends thereof via an insulation tape, and
        a band-like cover tape that is provided to cover the insulation-coated wire on the base tape and is overlapped at ends thereof via an insulation tape.

2. The lightning current detection sensor according to claim 1, further comprising:
    a base made of an insulating material; and
    a spacer that is interposed between the base and the core and forms a gap between the base and the coil portions.

3. The lightning current detection sensor according to claim 2, wherein a side plate standing upward from the base, and a top plate provided to cover an upper end of the side plate and above the core are provided integrally with the base, and the top plate holds a signal wire connected to the insulation-coated wire.

4. The lightning current detection sensor according to claim 1, wherein the base tape is made of a conductive material and grounded, and the cover tape is made of a conductive material and grounded.

5. The lightning current detection sensor according to claim 1, wherein the insulation-coated wire has a diameter of 1 mm or less.

6. The lightning current detection sensor according to claim 1, wherein the band-like base tape is circumferentially provided on an outer peripheral surface of the core.

7. The lightning current detection sensor according to claim 1, wherein the insulation-coated wire is wound around an outer peripheral side of the base tape.

* * * * *